United States Patent
Yoshikawa et al.

(10) Patent No.: US 12,163,252 B2
(45) Date of Patent: *Dec. 10, 2024

(54) METHOD FOR PRODUCING AN α- OR β-GALLIUM OXIDE CRYSTAL BY BRING AN AQUEOUS SOLUTION INCLUDING GA IONS INTO A SUPERCRITICAL STATE

(71) Applicant: NGK INSULATORS, LTD., Nagoya (JP)

(72) Inventors: Jun Yoshikawa, Nagoya (JP); Miho Maeda, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 156 days.

This patent is subject to a terminal disclaimer.

(21) Appl. No.: 17/650,672

(22) Filed: Feb. 11, 2022

(65) Prior Publication Data
US 2022/0162768 A1 May 26, 2022

Related U.S. Application Data

(63) Continuation of application No. PCT/JP2020/038172, filed on Oct. 8, 2020.

(30) Foreign Application Priority Data

Nov. 5, 2019 (JP) .................................. 2019-200475

(51) Int. Cl.
*C30B 7/10* (2006.01)
*C30B 29/16* (2006.01)

(52) U.S. Cl.
CPC ............. *C30B 7/10* (2013.01); *C30B 29/16* (2013.01)

(58) Field of Classification Search
CPC .. C30B 7/00; C30B 7/10; C30B 7/105; C30B 9/00; C30B 9/04; C30B 9/06; C30B 9/08; C30B 9/10; C30B 9/12; C30B 19/00; C30B 19/02; C30B 19/04; C30B 19/10; C30B 19/12; C30B 29/00; C30B 29/10; C30B 29/16
USPC ....... 117/11, 54, 64–68, 71, 73, 77–80, 937, 117/944
See application file for complete search history.

(56) References Cited

U.S. PATENT DOCUMENTS

| | | | | |
|---|---|---|---|---|
| 2023/0122462 A1* | 4/2023 | Yoshikawa | ............... | C30B 7/10 428/402 |
| 2024/0003043 A1* | 1/2024 | Yoshikawa | ............... | C30B 7/14 |

FOREIGN PATENT DOCUMENTS

| | | |
|---|---|---|
| JP | S55-104921 A | 8/1980 |
| JP | 2006-083217 A | 3/2006 |
| JP | 2012-076977 A | 4/2012 |

(Continued)

OTHER PUBLICATIONS

V.I. Anikeev publication entitled "Hydrothermal synthesis of metal oxide nano- and microparticles in supercritical water," Russian Journal of Physical Chemistry, vol. 85, pp. 377-382 (2011). (Year: 2011).*

(Continued)

*Primary Examiner* — Kenneth A Bratland, Jr.
(74) *Attorney, Agent, or Firm* — BURR PATENT LAW, PLLC

(57) ABSTRACT

An α- or β-$Ga_2O_3$ crystal is produced by bringing an aqueous solution including a Ga ion into a supercritical state having a temperature of 400° C. or more and a pressure of 22.1 MPa or more.

6 Claims, 4 Drawing Sheets

(56) References Cited

FOREIGN PATENT DOCUMENTS

| JP | 2014-072533 A | 4/2014 |
|---|---|---|
| JP | 2015-134717 A | 7/2015 |
| JP | 2016-025256 A | 2/2016 |
| RU | 2011 145 180 A | 5/2013 |

OTHER PUBLICATIONS

J.P. Remeika, et al. publication entitled "Growth of a-Ga2O3 single crystals at 44 kbars," Applied Physics Letters, vol. 8, pp. 87-88 (1966). (Year: 1966).*

Sahoo, et al. publication entitled "Hydrothermal growth and characterization of ZnO thin film on sapphire (0001) substrate with p-GaN buffer layer," Thin Solid Films, vol. 516, pp. 8244-8247 (2008). (Year: 2008).*

Man Hoi Wong et al., "Current Aperture Vertical $\beta$-$Ga_2O_3$ MOSFETs Fabricated by N- and Si-Ion Implantation Doping," *IEEE Electron Device Letters*, Mar. 2019, vol. 40, No. 3, pp. 431-434.

Richard E. Riman et al., "Hydrothermal Crystallization of Ceramics," *Ann. Chim. Sci. Mat.*, 2002, 27 (6), pp. 15-36.

Hai-Sheng Qian et al., "Template-Free Synthesis of Highly Uniform $\alpha$-GaOOH Spindles and Conversion to $\alpha$-$Ga_2O_3$ and $\beta$-$Ga_2O_3$," Crystal Growth & Design, 2008, vol. 8, No. 4, pp. 1282-1287.

V. I. Anikeev, "Hydrothermal Synthesis of Metal Oxide Nano- and Microparticles in Supercritical Water," *Russian Journal of Physical Chemistry A*, 2011, vol. 85, No. 3, pp. 377-382.

International Search Report and Written Opinion (PCT/JP2020/038172) dated Dec. 15, 2020 (with English translation).

English translation of the International Preliminary Report on Patentability (Chapter I) dated May 19, 2022 (Application No. PCT/JP2020/038172).

Chinese Office Action (with English translation) dated Jan. 8, 2024 (Application No. 202080048364.0).

Li Henglong et al., "*Aluminum Smelting Production Technology Handbook*," (vol. 1), Metallurgical Industry Press, pp. 747-748, Jul. 31, 2011.

Chinese Office Action (with English translation) dated Sep. 20, 2024 (Application No. 202080048364.0).

\* cited by examiner

METHOD FOR PRODUCING AN α- OR β-GALLIUM OXIDE CRYSTAL BY BRING AN AQUEOUS SOLUTION INCLUDING GA IONS INTO A SUPERCRITICAL STATE

BACKGROUND OF THE INVENTION

1. Field of the Invention

The present invention relates to a method for producing a gallium oxide crystal.

2. Description of the Related Art

Attention has been focused on the use of gallium oxide ($Ga_2O_3$) as a material for semiconductors. Gallium oxide is known to have five crystal forms: α, β, γ, δ, and ε. Among these, α-$Ga_2O_3$, which is a metastable phase, has been considered as a promising material for power semiconductors because it has a considerably large band gap (5.3 eV). For example, PTL 1 discloses a semiconductor device that includes a substrate having a corundum crystal structure, a semiconductor layer having a corundum crystal structure, and an insulation film having a corundum crystal structure. In PTL 1, an example in which an α-$Ga_2O_3$ film is disposed on a sapphire substrate as a semiconductor layer is described. PTL 2 discloses a semiconductor device that includes an n-type semiconductor layer including a crystalline oxide semiconductor having a corundum structure, the crystalline oxide semiconductor serving as a principal component; a p-type semiconductor layer including an inorganic compound having a hexagonal crystal structure, the inorganic compound serving as a principal component; and an electrode. In Examples of PTL 2, it is disclosed that a diode is prepared by forming an α-$Ga_2O_3$ film having a corundum structure, which is a metastable phase, as an n-type semiconductor layer and an α-$Rh_2O_3$ film having a hexagonal crystal structure, which serves as a p-type semiconductor layer, on a c-plane sapphire substrate. Furthermore, it is considered that α-$Ga_2O_3$ can also be applied to fluorescent materials. It is considered that β-$Ga_2O_3$ can be used as a semiconductor material for high-performance power devices as described in, for example, NPL 1. It is also considered that β-$Ga_2O_3$ can be applied to gas sensors, transparent conductive films, deep ultraviolet photodetectors, EL light emitting devices, catalysts, and the like.

Hydrothermal synthesis is commonly known as a method that enables the synthesis of a high-quality crystal at a relatively low temperature and low costs (e.g., NPL 2). A known approach to producing $Ga_2O_3$ by hydrothermal synthesis is to synthesize GaOOH and subsequently perform a heat treatment to prepare an α-$Ga_2O_3$ or β-$Ga_2O_3$ crystal as in NPL 3. A method in which a $Ga_2O_3$ crystal is formed in supercritical water having a temperature of 365° C. to 384° C. and a pressure of 235 atm (about 23.8 MPa) as in NPL 4 is also known.

CITATION LIST

Patent Literature

PTL 1: JP 2014-72533 A
PTL 2: JP 2016-25256 A

Non Patent Literature

NPL 1: IEEE ELECTRON DEVICE LETTERS, VOL. 40, NO. 3, MARCH 2019, pp. 431-434
NPL 2: Ann. Chim. Sci. Mat., 2002, 27(6), pp. 15-36 NPL 3: Crystal Growth & Design, Vol. 8, No. 4, 2008, pp. 1282-1287
NPL 4: Russian Journal of Physical Chemistry A, 2011, Vol. 85, No. 3, pp. 377-382

SUMMARY OF THE INVENTION

However, in the method according to NPL 3, since the α- or β-$Ga_2O_3$ crystal is formed by the heat treatment of GaOOH, a large number of micropores, which presumably result from the desorption of OH groups, may be formed in the crystal. It is not preferable to apply such a $Ga_2O_3$ crystal to semiconductor devices and the like, because they may cause leakage and the like. Although a $Ga_2O_3$ crystal can be produced by the method according to NPL 4, the crystal form thereof is a γ-$Ga_2O_3$ crystal, which is not known as a power device semiconductor. For the above reasons, the production of an α- or β-$Ga_2O_3$ crystal with little micropores has been anticipated.

The present invention was made in order to address the above issues. A main object of the present invention is to produce an α- or β-$Ga_2O_3$ crystal with little micropores.

A method for producing a gallium oxide crystal according to the present invention includes bringing an aqueous solution including Ga ions into a supercritical state having a temperature of 400° C. or more and a pressure of 22.1 MPa or more to form an α- or β-$Ga_2O_3$ crystal.

The above production method enables the formation of α- or β-$Ga_2O_3$ crystal with little micropores. It is known that water is brought into the supercritical state at a temperature of 374° C. or more and a pressure of 22.1 MPa or more. Even in the case where an aqueous solution including Ga ions is brought into a supercritical state, only a γ-$Ga_2O_3$ crystal can be formed when the temperature and pressure are set to 365° C. to 384° C. and 23.8 MPa as in NPL 4. However, an α- or β-$Ga_2O_3$ crystal can be formed when the temperature and pressure are set to 400° C. or more and 22.1 MPa or more as in the production method according to the present invention. Moreover, the production method according to the present invention enables the formation of an α- or β-$Ga_2O_3$ crystal with little micropores.

DETAILED DESCRIPTION OF THE INVENTION

Figure 1:
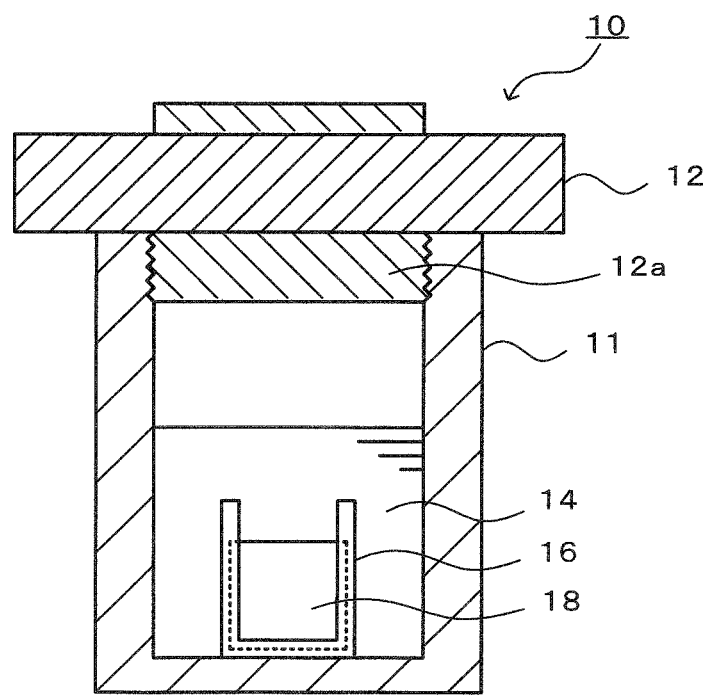
FIG. 1 is a longitudinal cross-sectional view of a pressure-resistant container 10.
Figure 2:
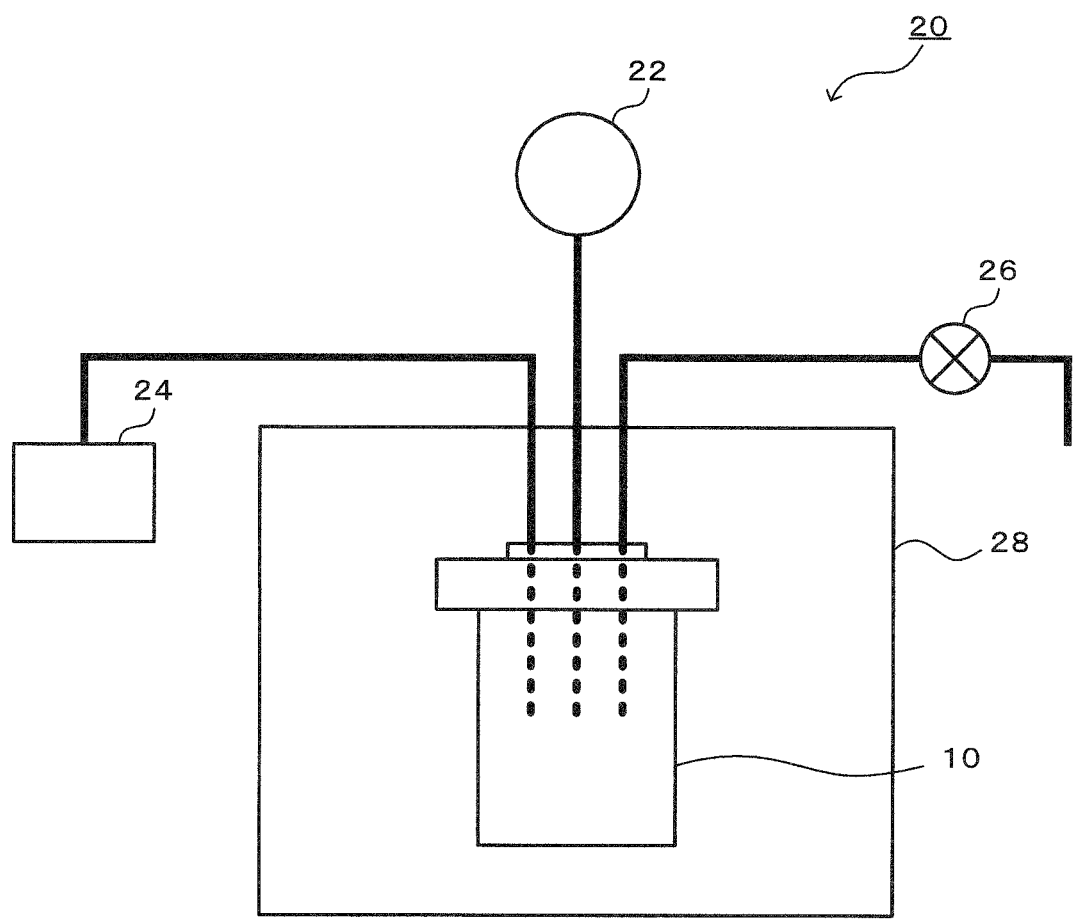
FIG. 2 is a schematic diagram illustrating an apparatus 20 for producing gallium oxide.

A preferred embodiment of the present invention is described below with reference to the attached drawings. FIG. 1 is a longitudinal cross-sectional view of a pressure-resistant container 10. FIG. 2 is a schematic diagram illustrating an apparatus 20 for producing gallium oxide.

A method for producing gallium oxide according to this embodiment includes bringing an aqueous solution including Ga ions into a supercritical state having a temperature of 400° C. or more and a pressure of 22.1 MPa or more to form an α- or β-$Ga_2O_3$ crystal.

Examples of the aqueous solution including Ga ions include an aqueous gallium halide solution, an aqueous gallium nitrate solution, an aqueous gallium sulfate solution, and an aqueous gallium hydroxide solution. Examples of the gallium halide include gallium chloride, gallium bromide, and gallium iodide. The aqueous solution including Ga ions may include alkali metal ions. For example, the aqueous solution including Ga ions may be prepared by adjusting the pH of an acidic aqueous solution including Ga ions with a pH-control agent including alkali metal ions. In such a case, an aqueous solution of an alkali metal hydroxide (e.g., an aqueous KOH solution) may be used as a pH-control agent. The aqueous solution including Ga ions may include ammonium ions. For example, the aqueous solution including Ga ions may be prepared by adjusting the pH of an acidic aqueous solution including Ga ions with a pH-control agent including ammonium ions. In such a case, an aqueous solution including ammonium ions (e.g., ammonium water) may be used as a pH-control agent. The Ga ion concentration in the aqueous solution including Ga ions may be, for example, but not limited to, 0.1 M or more and 10 M or less.

For bringing the aqueous solution including Ga ions into a supercritical state having a temperature of 400° C. or more and a pressure of 22.1 MPa or more, it is preferable to charge the aqueous solution including Ga ions into a pressure-resistant container and set the temperature and pressure to 400° C. or more and 22.1 MPa or more. The above temperature is 400° C. or more and may be 400° C. or more and 800° C. or less. Although the above operation can be done even when the temperature exceeds 800° C., the cost of a pressure-resistant container that can be used under the temperature and pressure conditions is high. The above pressure is 22.1 MPa or more and may be 28.0 MPa or more. Although the upper limit for the above pressure is not set, setting the pressure to 100 MPa or more increases the cost of the pressure-resistant container. The pressure is determined by the inner capacity of the pressure-resistant container, the amount of the aqueous solution charged in the pressure-resistant container, the temperature inside the pressure-resistant container, and the settings of a pressure control valve. The amount of time during which a reaction is conducted may be, for example, but not limited to, 0.5 hours or more and 100 hours or less. After the reaction has been terminated, the temperature inside the pressure-resistant container is reduced and the product, that is, gallium oxide, is then removed from the pressure-resistant container. In the case where the aqueous solution including Ga ions includes alkali metal ions, α-$Ga_2O_3$ is likely to grow selectively. In the case where the aqueous solution including Ga ions includes ammonium ions, β-$Ga_2O_3$ is likely to grow selectively. In the case where the pH of the aqueous solution including Ga ions is 7.0 or more or, in particular, 9.0 or more, α-$Ga_2O_3$ is likely to grow selectively. In the case where the pH of the aqueous solution including Ga ions is less than 7.0 or, in particular, less than 6.5, β-$Ga_2O_3$ is likely to grow selectively.

A seed crystal substrate may be immersed in the aqueous solution including Ga ions. Examples of the seed crystal substrate include a sapphire substrate and a substrate composed of an oxide having a lattice constant closer to that of α- or β-$Ga_2O_3$ than sapphire. Other examples of the seed crystal substrate include an α- or β-$Ga_2O_3$ single-crystal substrate and a substrate that includes an α- or β-$Ga_2O_3$ single-crystal film disposed on the surface thereof. In the case where the sapphire substrate is used, $Ga_2O_3$ grows on the sapphire substrate in a particulate form. In the case where any of the α- or β-$Ga_2O_3$ single-crystal substrate and the substrate that includes an α- or β-$Ga_2O_3$ single-crystal film disposed on the surface thereof is used, $Ga_2O_3$ having the same crystal form as the seed crystal grows on the seed crystal substrate in a film-like form. When the sizes of the pressure-resistant container and the oxide substrate are increased, a large $Ga_2O_3$ film having a size appropriate to the size of the substrate can be formed. The aqueous solution including Ga ions may include seed crystal grains dispersed therein. Examples of the seed crystal grains include α- or β-$Ga_2O_3$ crystal grains. It is suitable to use $Ga_2O_3$ crystal grains having the same crystal form as the $Ga_2O_3$ that is to be formed by the method for producing gallium oxide according to this embodiment. In the case where the above-described seed crystal grains are used, $Ga_2O_3$ grows on the seed crystal grains.

In the case where α- or β-$Ga_2O_3$ including a dopant is to be formed, ions that corresponds to the dopant may be added to the aqueous solution including Ga ions. Examples of the dopant include Group-14 elements, such as carbon (C), silicon (Si), germanium (Ge), tin (Sn), and lead (Pb). The electrical conductivity of α- or β-$Ga_2O_3$ can be controlled by adding the dopant to the α- or β-$Ga_2O_3$.

FIG. 1 illustrates an example of the pressure-resistant container. A pressure-resistant container 10 illustrated in FIG. 1 is made of a stainless steel and includes a closed-end cylindrical container main body 11 and a lid 12 including a protrusion 12a including a male thread formed thereon, the lid 12 being screwed into a female thread formed at the opening of the container main body 11. The container main body 11 of the pressure-resistant container 10 contains an aqueous solution 14 including Ga ions. A seed crystal substrate 18, which is supported by a substrate supporting fixture 16 made of Pt in an upright position, is immersed in the aqueous solution 14.

FIG. 2 illustrates an example of the apparatus for producing gallium oxide. A production apparatus 20 illustrated in FIG. 2 includes the pressure-resistant container 10, a pressure sensor 22, a temperature sensor 24, and a pressure control valve 26 that are hermetically attached to the pressure-resistant container 10, and an electric furnace 28 in which the pressure-resistant container 10 is placed. The electric furnace 28 heats the entirety of the pressure-resistant container 10 such that the internal temperature of the container reaches 400° C. or more and the internal pressure of the container reaches 22.1 MPa or more. Since the internal pressure of the container is determined by the inner capacity of the pressure-resistant container 10, the amount of the aqueous solution 14 charged in the pressure-resistant container 10, the internal temperature of the container, and the settings of the pressure control valve 26, the amount of the aqueous solution 14 charged in the pressure-resistant container 10 is adjusted such that the internal pressure of the container reaches 22.1 MPa or more when the internal temperature of the container is 400° C. or more. Holding is performed for a predetermined amount of time in the above state. Subsequently, after the internal temperature of the container has been reduced to room temperature, the seed crystal substrate 18 on which α- or β-$Ga_2O_3$ is deposited is removed from the pressure-resistant container 10. Then, rinsing is performed with pure water and, subsequently, drying is performed with a dryer.

In the pressure-resistant container 10 illustrated in FIG. 1, the substrate supporting fixture 16 and the seed crystal substrate 18 may be omitted. In such a case, α- or β-$Ga_2O_3$ grows in the solution in a particulate form, instead of being deposited on the seed crystal substrate 18. The particles of α- or β-Ga$_2$O$_3$ are removed from the pressure-resistant container 10, rinsed with pure water, and then dried with a dryer.

The method for producing gallium oxide according to the above-described embodiment enables an α- or β-Ga$_2$O$_3$ crystal with little micropores to be produced at relatively low costs.

It is needless to say that the present invention is not limited by the foregoing embodiment and can be implemented in various aspects without departing from the technical scope of the present invention.

EXAMPLES

Examples of the present invention are described below. Note that the present invention is not limited by Examples below.

Example 1

1. Hydrothermal Synthesis

A 0.1 M aqueous solution of gallium nitrate octahydrate (produced by Kishida Chemical Co., Ltd.) was prepared. The pH of the aqueous solution was adjusted to 7 using a 1 M aqueous KOH solution as a pH-control agent. Hereby, a raw material solution was prepared. Subsequently, a 10 millimeters-square c-plane sapphire substrate (seed crystal substrate 18) was placed in a pressure-resistant container 10 (inside diameter: 16 mm, inner capacity: 10 mL) made of SUS316 in an upright position with a substrate supporting fixture 16 made of Pt, as illustrated in FIG. 1. To the container, 6 mL of the raw material solution (aqueous solution 14) was charged. Subsequently, the container was hermetically sealed. Then, as illustrated in FIG. 2, a pressure sensor 22, a temperature sensor 24, and a pressure control valve 26 were hermetically attached to the pressure-resistant container 10, and the container was placed in an electric furnace 28. The entirety of the pressure-resistant container 10 was heated with the electric furnace 28 such that the internal temperature (maximum temperature) of the container reached 420° C. At this time, the internal pressure of the container was 29.0 MPa. Holding was performed for five hours in this state. Subsequently, the internal temperature of the container was reduced to room temperature in order to complete the hydrothermal synthesis treatment. Then, the substrate 18 on which particles were deposited was removed from the pressure-resistant container 10. Then, rinsing was performed with pure water and, subsequently, drying was performed with a dryer.

2. Evaluation

Figure 3:
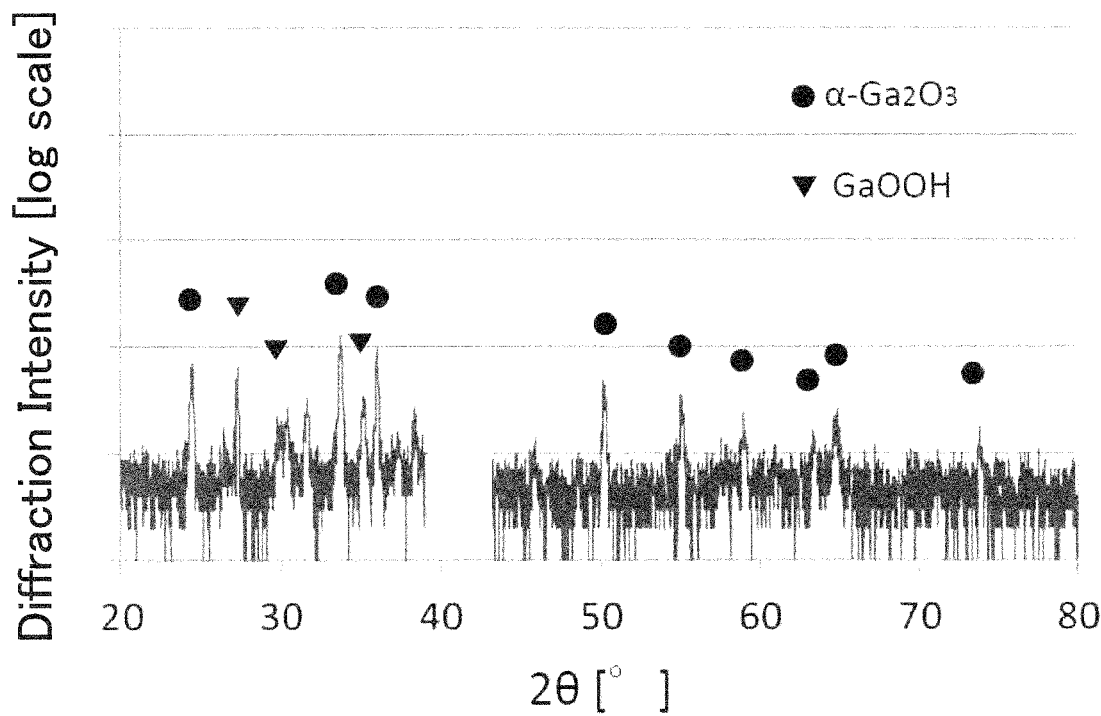
FIG. 3 is an XRD profile of a product prepared in Example 1.
Figure 4:
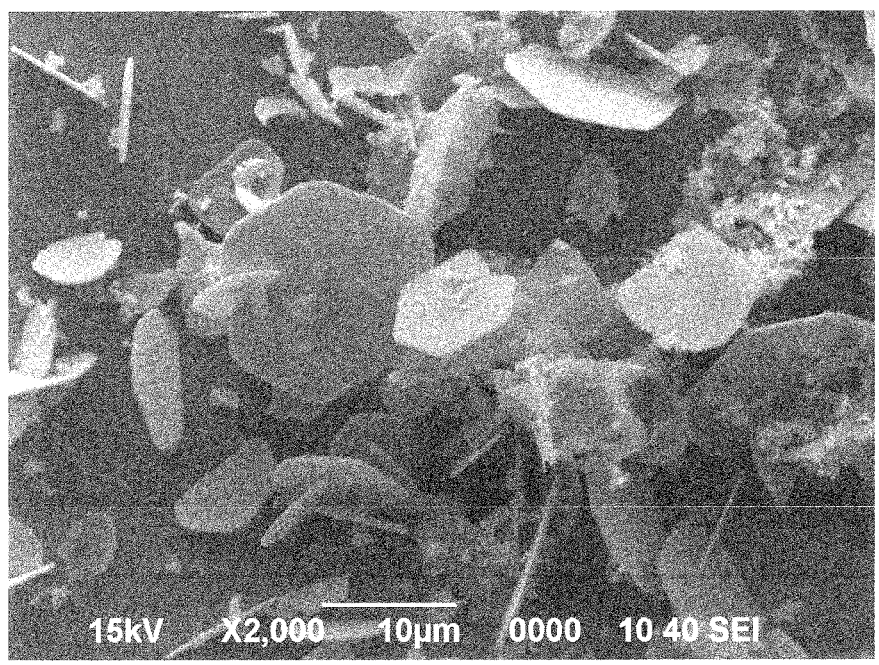
FIG. 4 is an SEM image of the product prepared in Example 1.

An XRD profile of the particles deposited on the surface of the sapphire substrate was obtained with an XRD apparatus ("RINT-TTR III" produced by Rigaku Corporation) under the conditions of tube voltage: 50 kV, tube current: 300 mA, and 2θ: 20° to 80° in order to identify crystal phase. Note that the vicinity (40° to 43°) of the diffraction peak of the (006) plane of sapphire (α-Al$_2$O$_3$) was excluded from the measurement in order to prevent the XRD detector from being broken by a strong diffraction peak. As a result, α-Ga$_2$O$_3$ was detected as a primary phase of the product as illustrated in the XRD profile of FIG. 3. The particles deposited on the surface of the sapphire substrate were observed with an SEM (2000-fold magnification; the same applies hereinafter). The results of the observation confirmed the presence of a hexagonal plate-like crystal resulting from the corundum structure of α-Ga$_2$O$_3$ as illustrated in FIG. 4. The crystal did not have pores formed therein. The maximum diameter (major-axis length) of the largest of the crystal grains was more than 10 μm.

Example 2

1. Hydrothermal Synthesis

Hydrothermal synthesis was performed as in Example 1, except that the pH-control agent added to the raw material solution was changed to ammonia water (produced by Taiseikakou). Hereby, a sapphire substrate including particles deposited on the surface thereof was prepared.

2. Evaluation

Figure 5:
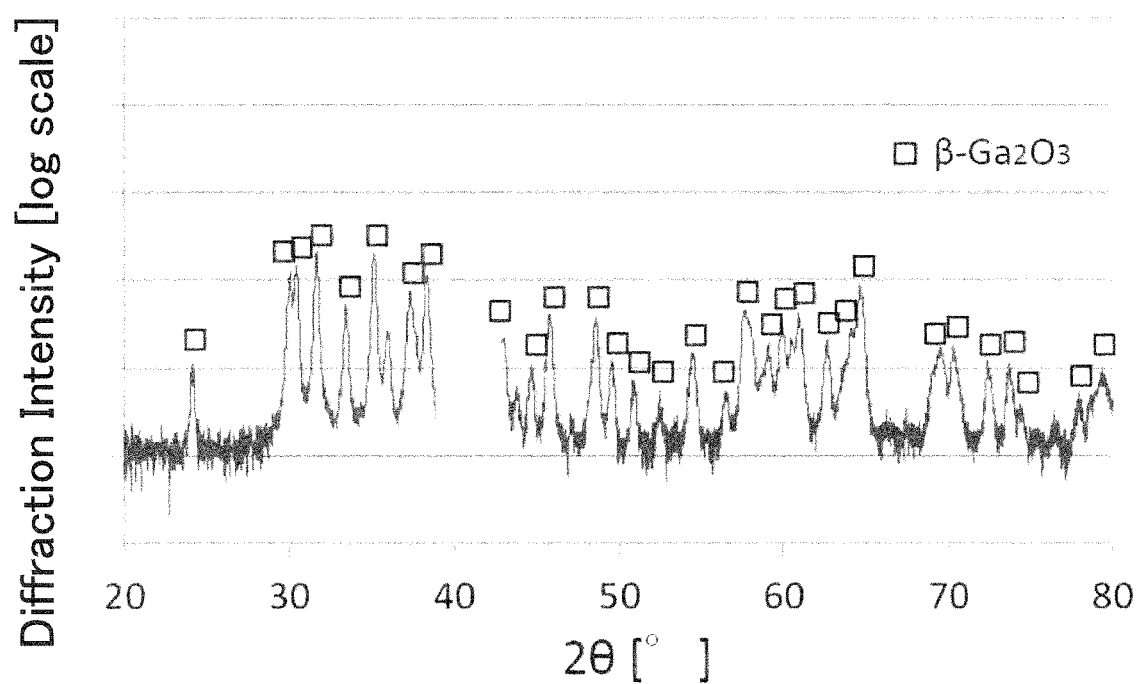
FIG. 5 is an XRD profile of a product prepared in Example 2.

The crystal phase of the particles deposited on the surface of the sapphire substrate was identified by XRD as in Example 1. The results of the identification confirmed the presence of β-Ga$_2$O$_3$ as illustrated in the XRD profile of FIG. 5. The particles deposited on the surface of the sapphire substrate were observed with an SEM. The results of the observation confirmed that the β-Ga$_2$O$_3$ crystal did not have pores formed therein.

Example 3

A hydrothermal synthesis treatment was performed as in Example 1, except that the pH of the raw material solution was adjusted to 10.0, the Pt fixture and the sapphire substrate were not immersed in the solution, and the pressure control valve was adjusted such that the internal pressure of the pressure-resistant container reached 22.5 MPa at the maximum temperature. The resulting particles were removed from the pressure-resistant container, rinsed with pure water, and then dried with a dryer. An XRD profile of the above particles was obtained as in Example 1. The results of the measurement confirmed the presence of α-Ga$_2$O$_3$ as a primary phase. The particles were observed with an SEM. The results of the observation confirmed that the α-Ga$_2$O$_3$ crystal did not have pores formed therein. The maximum diameter of the largest of the crystal grains was more than 50 μm. The crystal grains were substantially hexagonal and plate-like but had a larger thickness/diameter than those prepared in Example 1. Relatively isotropic shaped crystal grains were present in a large amount.

Example 4

A hydrothermal synthesis treatment was performed as in Example 3, except that the maximum temperature was changed to 400° C. and the pressure control valve was adjusted such that the internal pressure of the pressure-resistant container reached 25.0 MPa at the maximum temperature. An XRD profile of the resulting particles was obtained as in Example 3. The results of the measurement confirmed the presence of α-Ga$_2$O$_3$ as a primary phase. The particles were observed with an SEM. The results of the observation confirmed that the α-Ga$_2$O$_3$ crystal did not have pores formed therein. The crystal grains had a maximum diameter and a shape comparable to those of the crystal grains prepared in Example 3.

Example 5

A hydrothermal synthesis treatment was performed as in Example 3, except that the pH of the raw material solution was changed to 6.0, the maximum temperature was changed to 400° C., and the pressure control valve was adjusted such that the internal pressure of the pressure-resistant container reached 30.0 MPa at the maximum temperature. An XRD profile of the resulting particles was obtained as in Example 3. The results of the measurement confirmed the presence of $\beta$-$Ga_2O_3$ as a primary phase. The particles were observed with an SEM. The results of the observation confirmed that the $\beta$-$Ga_2O_3$ crystal did not have pores formed therein.

Example 6

The synthesis of particles was performed under the same conditions as in Example 3, except that, to the raw material solution, 5 mg of the particles prepared under the same conditions as in Example 3 were added as a seed crystal. An XRD profile of the resulting particles was obtained as in Example 1. The results of the measurement confirmed the presence of $\alpha$-$Ga_2O_3$ as a primary phase. The particles were observed with an SEM. The results of the observation confirmed that the $\alpha$-$Ga_2O_3$ crystal did not have pores formed therein. The maximum diameter of the largest of the crystal grains was more than 100 μm. The crystal grains were substantially hexagonal and plate-like but had a larger thickness/diameter than those prepared in Example 1. Relatively isotropic shaped crystal grains were present in a large amount.

The present application claims priority from Japanese Patent Application No. 2019-200475, filed on Nov. 5, 2019, the entire contents of which are incorporated herein by reference.

What is claimed is:

1. A method for producing a gallium oxide crystal, the method comprising:
    bringing an aqueous solution including Ga ions into a supercritical state having a temperature of 400° C. or more and 800° C. or less and a pressure of 22.1 MPa or more and less than 100 MPa to form an $\alpha$- or $\beta$-$Ga_2O_3$ crystal.

2. The method for producing a gallium oxide crystal according to claim 1,
    wherein a sapphire substrate is immersed in the aqueous solution, the sapphire substrate serving as a seed crystal substrate.

3. The method for producing a gallium oxide crystal according to claim 1,
    wherein the aqueous solution includes alkali metal ions.

4. The method for producing a gallium oxide crystal according to claim 3,
    wherein the aqueous solution is prepared by adjusting a pH of an acidic aqueous solution including Ga ions with a pH-control agent including alkali metal ions.

5. The method for producing a gallium oxide crystal according to claim 1,
    wherein the aqueous solution includes ammonium ions.

6. The method for producing a gallium oxide crystal according to claim 5,
    wherein the aqueous solution is prepared by adjusting a pH of an acidic aqueous solution including Ga ions with a pH-control agent including ammonium ions.

* * * * *